(12) United States Patent
Inoue (10) Patent No.: US 11,482,982 B2
(45) Date of Patent: Oct. 25, 2022

(54) ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 346 days.

(21) Appl. No.: 16/901,032

(22) Filed: Jun. 15, 2020

(65) Prior Publication Data

US 2020/0313644 A1 Oct. 1, 2020

Related U.S. Application Data

(63) Continuation of application No. PCT/JP2018/044599, filed on Dec. 4, 2018.

(30) Foreign Application Priority Data

Dec. 27, 2017 (JP) .............................. JP2017-251035

(51) Int. Cl.
*H03H 9/02* (2006.01)
*H03H 3/10* (2006.01)
(Continued)

(52) U.S. Cl.
CPC .......... *H03H 9/02897* (2013.01); *H03H 3/10* (2013.01); *H03H 9/02834* (2013.01);
(Continued)

(58) Field of Classification Search
CPC .. H03H 9/02897; H03H 3/10; H03H 9/02834; H03H 9/059; H03H 9/1092;
(Continued)

(56) References Cited

U.S. PATENT DOCUMENTS 10,228,350 B2 * 3/2019 Kobayashi ........... G01N 29/222
2004/0145278 A1 7/2004 Iwamoto
(Continued)

FOREIGN PATENT DOCUMENTS

JP 2004-248243 A 9/2004
JP 2005-191740 A 7/2005
(Continued)

OTHER PUBLICATIONS

Official Communication issued in International Patent Application No. PCT/JP2018/044599, dated Feb. 5, 2019.

*Primary Examiner* — Eugene Yun
(74) *Attorney, Agent, or Firm* — Keating & Bennett, LLP (57) ABSTRACT

A through-hole that extends from an upper surface of a cover opposite a support to a lower surface of the support facing a substrate is provided in the support and the cover. The through-hole overlaps a portion of a wiring line in a plan view. An acoustic wave device further includes an electrode film that is electrically connected to the wiring line in the through-hole, and a protective layer that includes an insulating material and that covers a portion of the electrode film. The protective layer is connected to the cover and the support in the through-hole. Differences in thermal expansion coefficients between the protective layer and the cover and between the protective layer and the support are smaller than a difference in thermal expansion coefficients between the protective layer and the electrode film.

14 Claims, 7 Drawing Sheets

(51) Int. Cl.
*H03H 9/05* (2006.01)
*H03H 9/10* (2006.01)
*H03H 9/145* (2006.01)
*H03H 9/25* (2006.01)

(52) U.S. Cl.
CPC .......... *H03H 9/059* (2013.01); *H03H 9/1092* (2013.01); *H03H 9/145* (2013.01); *H03H 9/25* (2013.01)

(58) Field of Classification Search
CPC ............ H03H 9/145; H03H 9/25; H03H 3/08; H03H 9/02133; H03H 9/14538; H01L 23/04
See application file for complete search history.

(56) References Cited

U.S. PATENT DOCUMENTS

| | | | |
|---|---|---|---|
| 2008/0277776 A1* | 11/2008 | Enomoto | H05K 1/115 257/E25.023 |
| 2010/0225202 A1 | 9/2010 | Fukano et al. | |
| 2014/0313681 A1* | 10/2014 | Yamano | H01L 25/105 361/764 |
| 2016/0284639 A1* | 9/2016 | Chen | H01L 24/02 |

FOREIGN PATENT DOCUMENTS

| | | |
|---|---|---|
| JP | 2007-324162 A | 12/2007 |
| JP | 2014-057124 A | 3/2014 |
| WO | 2009/057699 A1 | 5/2009 |

* cited by examiner

ACOUSTIC WAVE DEVICE

CROSS REFERENCE TO RELATED APPLICATIONS

This application claims the benefit of priority to Japanese Patent Application No. 2017-251035 filed on Dec. 27, 2017 and is a Continuation Application of PCT Application No. PCT/JP2018/044599 filed on Dec. 4, 2018. The entire contents of each application are hereby incorporated herein by reference.

BACKGROUND OF THE INVENTION

1. Field of the Invention

The present invention relates to an acoustic wave device, and more specifically, to the structure of an acoustic wave device that is able to reduce the effect of a thermal stress during mounting.

2. Description of the Related Art

For electronic devices, for example, cellular phones or smart phones, acoustic wave devices that include surface acoustic wave (SAW) or bulk acoustic wave (BAW) resonators are used. In recent years, the sizes and thicknesses of the electronic devices have been decreased, and the sizes of the acoustic wave devices themselves are preferably decreased accordingly.

Japanese Unexamined Patent Application Publication No. 2005-191740 discloses a surface acoustic wave device in which a surface acoustic wave element that includes an excitation electrode that is disposed on a main surface of a piezoelectric substrate is disposed such that the main surface of the piezoelectric substrate faces an upper surface of a base. The base has a through-hole that extends between the upper surface and a lower surface. The surface acoustic wave device includes a conductor pattern that blocks the through-hole and that is electrically connected to the excitation electrode, and an insulator that covers the conductor pattern. A similar structure is disclosed in Japanese Unexamined Patent Application Publication No. 2007-324162.

However, during heat treatment when the surface acoustic wave device disclosed in Japanese Unexamined Patent Application Publication No. 2005-191740 is mounted on a mounting substrate, there is a possibility that the insulator that covers the conductor pattern is separated from the conductor pattern. The reason is that a stress (thermal stress) is applied between the conductor pattern and the insulator due to a difference between the thermal expansion coefficient of the conductor pattern and the thermal expansion coefficient of the insulator.

SUMMARY OF THE INVENTION

Preferred embodiments of the present invention provide acoustic wave devices that are each able to reduce the effect of a thermal stress during mounting.

An acoustic wave device according to a preferred embodiment of the present invention includes a substrate, a functional element that is provided on the substrate, a wiring line that is provided on the substrate and that is electrically connected to the functional element, a support that is made of an insulating material and that is provided around the functional element on the substrate, and a cover that is made of an insulating material, that covers the functional element, and that faces the substrate with the support provided between the substrate and the cover. A through-hole that extends from a first surface of the cover opposite the support to a second surface of the support that faces the substrate is provided in the support and the cover. The through-hole overlaps a portion of the wiring line in a plan view. The acoustic wave device further includes an electrode film that is provided on the first surface and in the through-hole and that is electrically connected to the wiring line in the through-hole, and a protective layer that is made of an insulating material and that covers at least a portion of the first surface and a portion of the electrode film. The protective layer is connected to at least one of the cover and the support in the through-hole. A difference in thermal expansion coefficients between the protective layer and the at least of the cover and the support is smaller than a difference in thermal expansion coefficients between the protective layer and the electrode film.

The protective layer may be connected to the cover and the support in the through-hole. An inner wall surface around the through-hole may include a third surface of the cover that faces the substrate and a fourth surface of the support that is adjacent to the third surface. The protective layer is connected to the third surface and the fourth surface.

The protective layer may be connected to the substrate in the through-hole.

Acoustic wave devices according preferred embodiments of the present invention are able to reduce the effect of a thermal stress during mounting.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to the drawings. In the drawings, components like or corresponding to each other are designated by like reference characters, and a description thereof is not repeated. The drawings assist in understanding the preferred embodiments and are not necessarily made precisely. For example, in some cases, the ratio of dimensions of a component or between components in the drawings does not match the ratio of the dimensions thereof in the description. In some cases, a component in the description is omitted in the drawings, and the number thereof is omitted in the drawings.

Structure of Acoustic Wave Device

Figure 1:
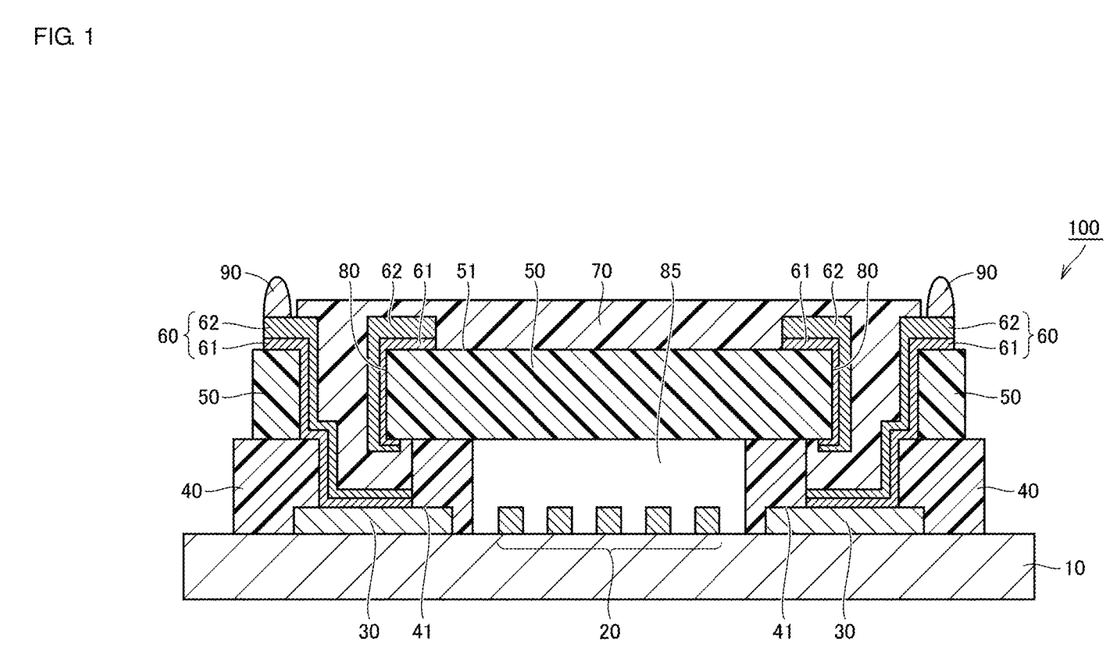
FIG. 1 is a sectional view of an acoustic wave device according to a preferred embodiment of the present invention.

FIG. 1 is a sectional view of an acoustic wave device according to a preferred embodiment of the present invention. An acoustic wave device 100 according to the present preferred embodiment includes comb-shaped electrodes (IDT: an interdigital transducer) that correspond to a functional element.

Referring to FIG. 1, the acoustic wave device 100 includes a substrate 10, a functional element 20, wiring lines 30, a support 40, a cover 50, electrode films 60, and a protective layer 70.

The substrate 10 is preferably made of, for example, a piezoelectric single crystal material such as lithium tantalate (LiTaO$_3$) or lithium niobate (LiNbO$_3$), a single crystal material such as alumina, silicon (Si), or sapphire, or a piezoelectric multilayer material including LiTaO$_3$ or LiNbO$_3$.

The functional element 20 is provided on the substrate 10. The functional element 20 includes a pair of IDT electrodes preferably made of, for example, a single metal of at least one selected from the group consisting of aluminum, copper, silver, gold, titanium, tungsten, platinum, chromium, nickel, and molybdenum, or an electrode material such as an alloy that includes any of these as a main component. The substrate 10 that has piezoelectricity and the IDT electrodes define a surface acoustic wave resonator.

Each wiring line 30 is provided on the substrate 10 and is electrically connected to the functional element 20. The wiring line 30 is made of the same or similar material as that of each IDT electrode of the functional element 20. An UBM (under-bump metallic) layer may be provided between the wiring line 30 and the functional element 20.

The support 40 has a frame shape by, for example, an insulating material such as synthetic resin or photosensitive resin. Examples of the photosensitive resin may include photosensitive polyimide, photosensitive epoxy resin, and photosensitive silicone resin. The support 40 is provided around the functional element 20 on the substrate 10. The support 40 is provided on a portion of each wiring line 30.

The cover 50 is preferably made of, for example, an insulating material such as epoxy resin or polyimide. The cover 50 covers the functional element 20 and faces the substrate 10 with the support 40 interposed between the substrate 10 and the cover 50. That is, a hollow space 85 is defined by the substrate 10, the support 40, and the cover 50, and the functional element 20 is located in the hollow space 85.

The support 40 is provided in a layer on the substrate 10 with photosensitive resin by, for example, a photolithography method. The cover 50 that has a sheet (layered) shape is joined to the support 40, for example, by being heated and pressurized. The support 40 and the cover 50 may be integrally provided and may be provided on the substrate 10.

Through-holes 80 that extend from an upper surface 51 of the cover 50 opposite the support 40 to a lower surface 41 of the support 40 that faces the substrate 10 are provided in the support 40 and the cover 50. The through-holes 80 overlap portions of the respective wiring lines 30.

The electrode films 60 are provided on the upper surface 51 of the cover 50 and in the respective through-holes 80 and are electrically connected to the respective wiring lines 30 in the through-holes 80. Each electrode film 60 includes a seed layer 61 and a plating layer 62 that is provided on the seed layer 61. The seed layer 61 is preferably made of, for example, a metal material such as Ti or Cu and is formed by sputtering. The plating layer 62 is preferably made of, for example, a metal material such as Cu or Ni and is formed by an electroplating method.

The protective layer 70 is preferably made of, for example, an insulating material such as epoxy resin or polyimide and covers at least a portion of the upper surface 51 of the cover 50 and a portion of each electrode film 60. The protective layer 70 may cover the entire upper surface 51 of the cover 50 or may cover a portion of the upper surface 51. A portion of the electrode film 60 that is not covered by the protective layer 70 is provided as an electric connection terminal with an external device via a solder 90.

Figure 2:
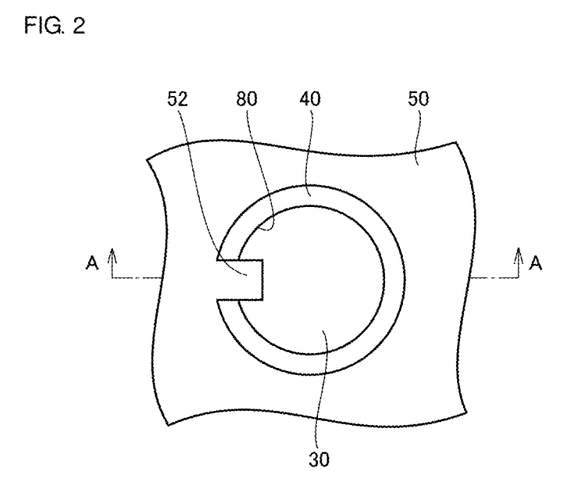
FIG. 2 is an enlarged plan view of a structure in a vicinity of a through-hole shown in FIG. 1.
Figure 3:
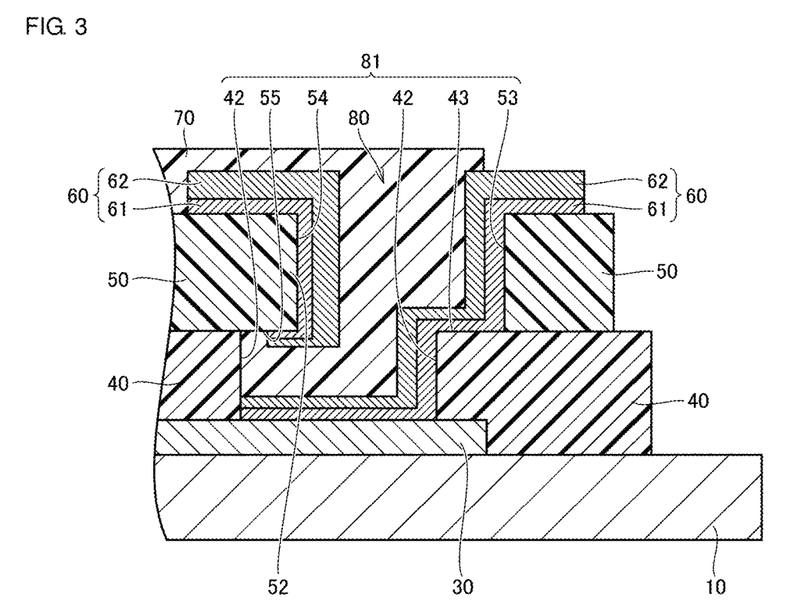
FIG. 3 is a sectional view taken along line A-A in FIG. 2.

FIG. 2 is an enlarged plan view of a structure in a vicinity of one of the through-holes 80. In FIG. 2, the electrode film 60 and the protective layer 70 are not shown to make it easy to understand the shape of the through-hole 80. FIG. 3 is a sectional view taken along line A-A in FIG. 2.

As shown in FIG. 2 and FIG. 3, the cover 50 includes a projecting portion 52 that projects from the support 40 inside the through-hole 80.

An inner wall surface 81 around the through-hole 80 includes a side surface 53 of the cover 50 except for the projecting portion 52, a side surface 54 of the projecting portion 52, a lower surface 55 of the projecting portion 52, a side surface 42 of the support 40, and an upper surface 43 of the support 40. The lower surface 55 of the projecting portion 52 is a surface of the cover 50 that faces the substrate 10. The side surface 42 of the support 40 is adjacent to the lower surface 55 of the projecting portion 52. Since the through-hole 80 is located above the wiring line 30 as described above, a portion of the wiring line 30 is exposed to the through-hole 80.

The electrode film 60 is provided on the inner wall surface 81 around the through-hole 80 and the wiring line 30 that is exposed to the through-hole 80. Accordingly, the electrode film 60 is electrically connected to the wiring line 30. The electrode film 60 is not provided on a portion of the inner wall surface 81: a portion of the lower surface 55 of the projecting portion 52 and a portion of the side surface 42 of the support 40 that is adjacent to the lower surface 55. Thus, the protective layer 70 is connected to the cover 50 and the support 40 in the through-hole 80.

A difference in the thermal expansion coefficients between the protective layer 70 and the cover 50 is smaller than a difference in the thermal expansion coefficients between the protective layer 70 and the electrode film 60. A difference in the thermal expansion coefficients between the protective layer 70 and the support 40 is smaller than a difference in the thermal expansion coefficients between the protective layer 70 and the electrode film 60. The support 40, the cover 50, and the protective layer 70 are preferably made of, for example, epoxy resin or polyimide as described above. The thermal expansion coefficient of epoxy resin is about $62 \times 10^{-6}$/K. The thermal expansion coefficient of polyimide is about $54 \times 10^{-6}$/K. Accordingly, the difference in the thermal expansion coefficients between the protective layer 70 and the cover 50 and the difference in the thermal expansion coefficients between the protective layer 70 and the support 40 are about 0 to about $10 \times 10^{-6}$/K. In the case where the electrode film 60 is made of a metal material, for example, silver, copper, nickel, or tin, the thermal expansion coefficient of the electrode film 60 is about $10 \times 10^{-6}$ to about $20 \times 10^{-6}$/K. Accordingly, the difference in the thermal expansion coefficients between the protective layer 70 and the electrode film 60 is about $30 \times 10^{-6}$ to about $50 \times 10^{-6}$/K.

The protective layer 70 is thus connected to the cover and the support 40, which have a smaller difference in the thermal expansion coefficients than that of the electrode film 60, in the through-hole 80. When the acoustic wave device 100 is mounted on a mounting substrate by heat treatment, a thermal stress that is applied between the protective layer 70 and the cover 50 and between the protective layer 70 and the support 40 is able to be smaller than a thermal stress that is applied between the protective layer 70 and the electrode film 60. Accordingly, joining force is maintained between the protective layer 70 and the cover 50 and between the protective layer 70 and the support 40, and separation of the protective layer 70 from the electrode film 60 is able to be significantly reduced or prevented.

Method of Manufacturing Acoustic Wave Device

Figure 5A:
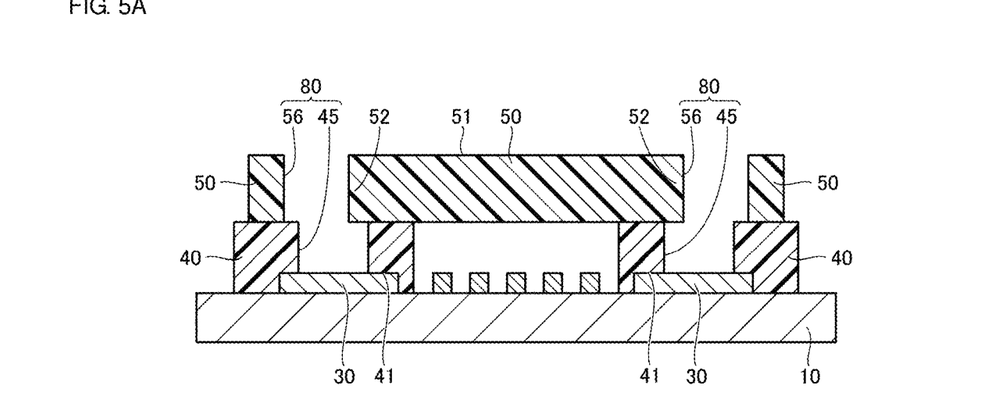
FIGS. 5A to 5C show fifth to seventh steps in the example of the method of manufacturing the acoustic wave device shown in FIG. 1.
Figure 5B:
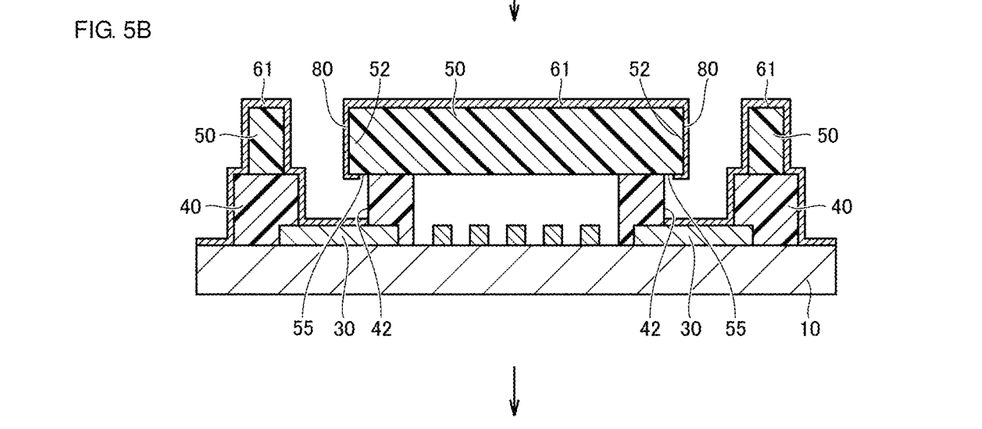
Figure 5C:
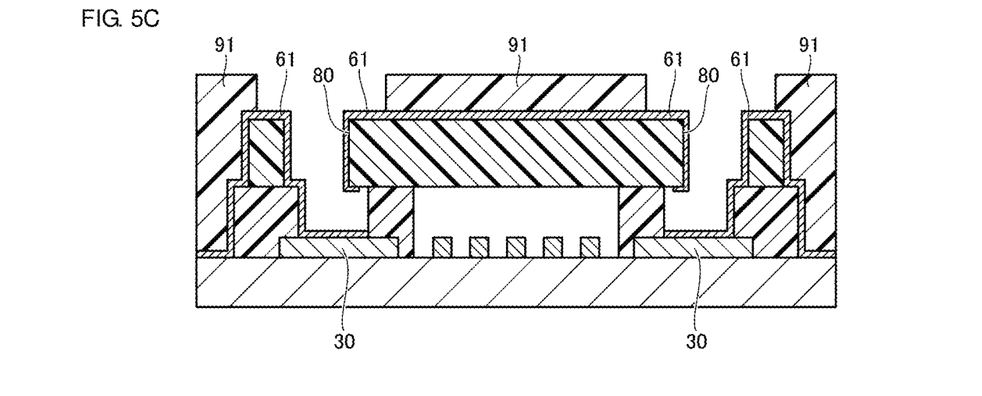
Figure 6A:
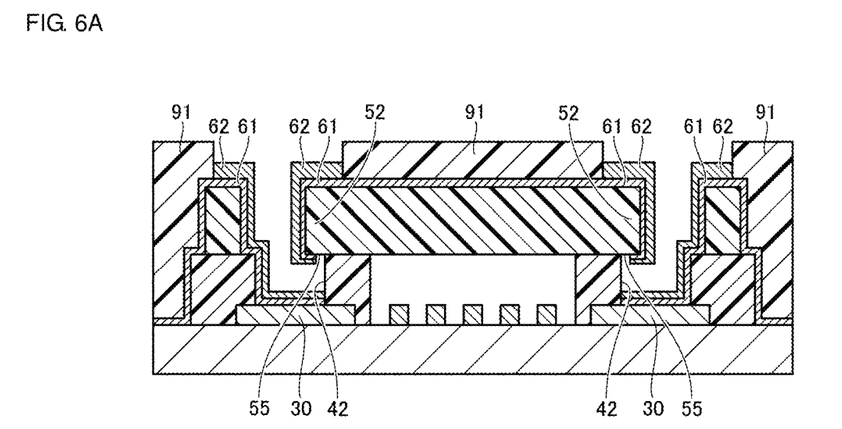
FIGS. 6A to 6C show eighth to tenth steps in the example of the method of manufacturing the acoustic wave device shown in FIG. 1.

An example of a method of manufacturing an acoustic wave device will now be described with reference to FIGS. 4A to 4D to FIGS. 6A to 6C. FIGS. 4A to 4D show first to fourth steps in an example of a method of manufacturing the acoustic wave device. FIGS. 5A to 5C show fifth to seventh steps in the example of the method of manufacturing the acoustic wave device. FIGS. 6A to 5C show eighth to tenth steps in the example of the method of manufacturing the acoustic wave device.

Figure 4A:
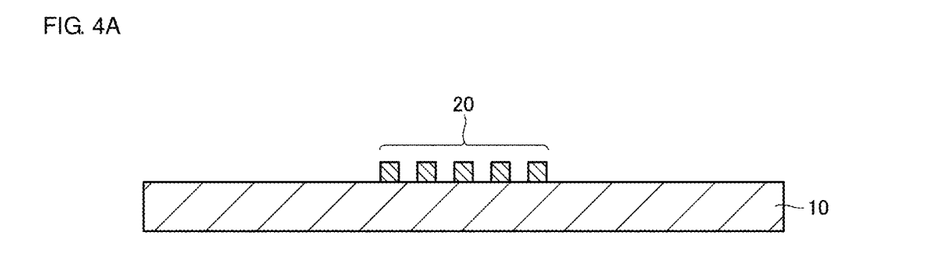
FIGS. 4A to 4D show first to fourth steps in an example of a method of manufacturing the acoustic wave device shown in FIG. 1.
Figure 4B:
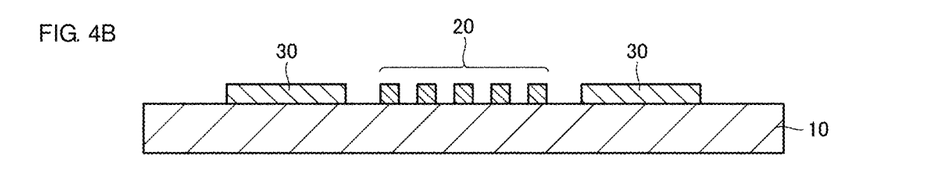

Firstly, as shown in FIG. 4A, the functional element 20 that includes, for example, the IDT electrodes, is formed on a main surface of the substrate 10 by, for example, a lift-off method (first step). As shown in FIG. 4B, the wiring lines 30 that are electrically connected to the functional element 20 are formed on the main surface of the substrate 10 by, for example, a lift-off method (second step). The functional element 20 and the wiring lines 30 may be simultaneously formed.

Figure 4C:
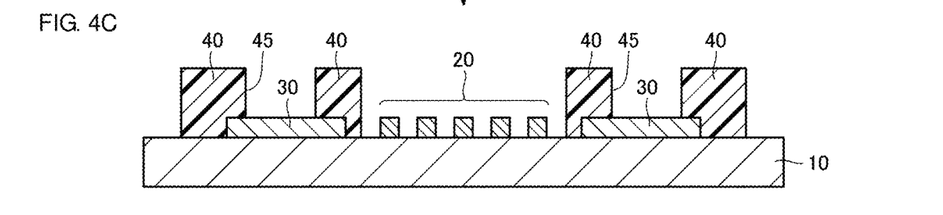

Subsequently, as shown in FIG. 4C, the support 40 that has a frame shape is formed around the functional element 20 by, for example, patterning photosensitive resin on the main surface of the substrate 10 (third step). Through-holes 45 are formed at positions where the support 40 overlaps portions of the wiring lines 30.

Figure 4D:
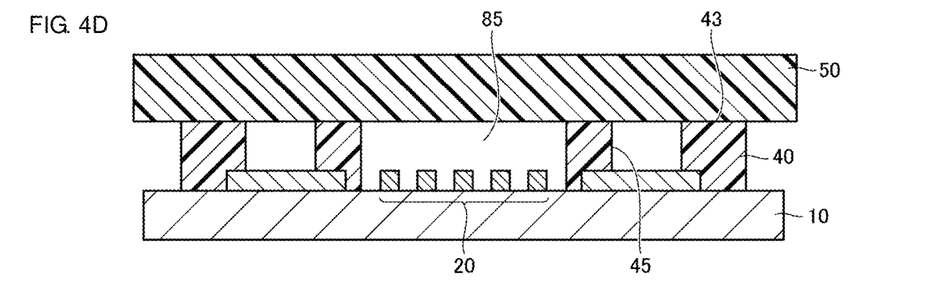

Subsequently, as shown in FIG. 4D, the cover 50 that is made of photosensitive resin and that has a sheet shape is joined to the upper surface 43 of the support 40 opposite the substrate (fourth step). Accordingly, the hollow space 85 is defined by the substrate 10, the support 40, and the cover 50, and the functional element 20 is located in the hollow space 85.

Subsequently, as shown in FIG. 5A, portions of the cover 50 are exposed to light to form through-holes 56 in communication with the respective through-holes 45 of the support 40 (fifth step). Accordingly, the through-holes 80 that extend from the upper surface 51 of the cover 50 opposite the support 40 to the lower surface 41 of the support 40 that faces the substrate 10 are formed in the cover 50 and the support 40. That is, the through-holes 45 and the through-holes 56 form the through-holes 80. The projecting portions 52 are formed by portions of the cover 50 projecting from the support 40 inside the through-holes 80.

Subsequently, as shown in FIG. 5B, metal atoms are deposited on the cover 50 in the through-holes by sputtering to form the seed layers 61 (sixth step). At this time, the metal atoms do not reach the lower surface 55 of each projecting portion 52 and a portion of the side surface 42 of the support 40 below the projecting portion 52. Accordingly, each seed layer 61 is not formed on the lower surface 55 of the projecting portion 52 or the portion of the side surface 42 of the support 40.

Subsequently, as shown in FIG. 5C, plating resists 91 are formed in regions except for the through-holes 80 and regions therearound by a patterning method (seventh step). Subsequently, as shown in FIG. 6A, the plating layers 62 are formed by, for example, an electroplating method (eighth step). The plating layers 62 and the seed layers 61 form the electrode films 60. The plating layers 62 are formed only on the seed layers 61 and are not formed in a region in which the seed layers 61 are not formed. Accordingly, the lower surface 55 of each projecting portion 52 and the portion of the side surface 42 of the support 40 are exposed from the electrode films.

Figure 6B:
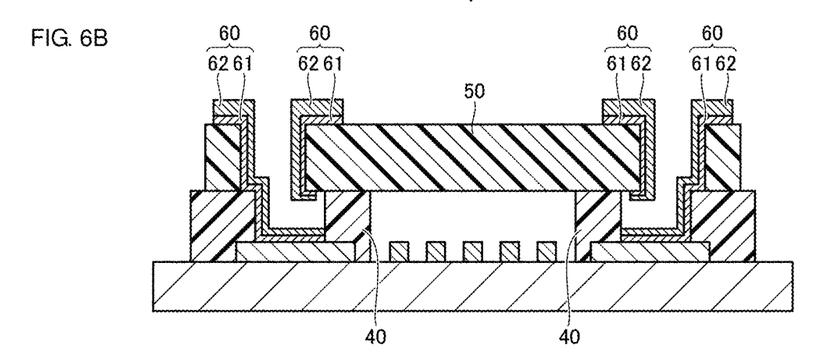
Figure 6C:
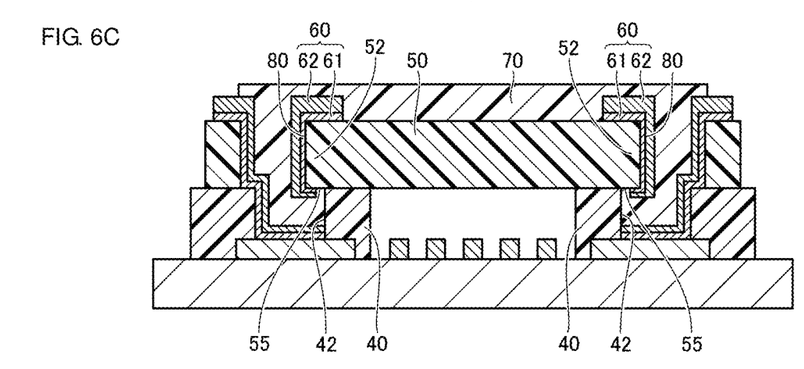

Subsequently, as shown in FIG. 6B, the plating resists 91 are removed, and portions of the seed layers 61 that cover the plating resists 91 are removed (ninth step). Finally, as shown in FIG. 6C, the protective layer 70 that covers the cover 50 and portions of the electrode films 60 is formed by, for example, applying liquid photosensitive resin and patterning the liquid photosensitive resin through exposure and development (tenth step). The protective layer 70 is filled in the through-holes 80 and is connected to the cover 50 and the support 40 in regions in which the electrode films 60 are not formed. Specifically, the protective layer 70 is connected to the lower surface 55 of each projecting portion 52 and the portion of the side surface 42 of the support 40.

Advantages

Regarding the acoustic wave device 100 described above, the through-holes 80 that extend from the upper surface 51 of the cover 50 opposite the support 40 to the lower surface 41 of the support 40 that faces the substrate 10 are provided in the support 40 and the cover 50. The through-holes 80 overlap portions of the wiring lines 30 in a plan view. The acoustic wave device 100 also includes the electrode films 60 that are provided on the upper surface 51 and in the through-holes 80 and that are electrically connected to the wiring lines 30 in the through-holes 80, and the protective layer 70 that is made of an insulating material and that covers at least a portion of the upper surface 51 and portions of the electrode films 60. The protective layer 70 is connected to the cover 50 and the support 40 in the through-holes 80. The differences in the thermal expansion coefficients between the protective layer and the cover 50 and between the protective layer and the support 40 are smaller than the difference in the thermal expansion coefficients between the protective layer 70 and each electrode film 60. Accordingly, the thermal stress between the protective layer 70 and the cover 50 and between the protective layer 70 and the support 40 is able to be smaller than the thermal stress between the protective layer 70 and each electrode film 60 when the acoustic wave device 100 is mounted on the mounting substrate by heat treatment. That is, the effect of the thermal stress during mounting is able to be reduced. Accordingly, separation the protective layer 70 from each electrode film 60 is able to be significantly reduced or prevented.

First Modification

In the above description, the protective layer 70 is connected to the cover 50 and the support 40 in the through-holes 80. However, the protective layer 70 may be connected to only the cover 50 or the support 40 in the through-holes 80. For example, the protective layer 70 may be connected to only the cover 50, of the cover 50 and the support 40, in the through-holes 80. Accordingly, the difference in the thermal expansion coefficients between the protective layer 70 and the cover 50 is smaller than the difference in the thermal expansion coefficients between the protective layer 70 and each electrode film 60. The protective layer 70 may be connected to only the support 40, of the cover 50 and the support 40, in the through-holes 80. Accordingly, the difference in the thermal expansion coefficients between the protective layer 70 and the support 40 is smaller than the difference in the thermal expansion coefficients between the protective layer 70 and each electrode film 60. Also, according to a first modification of a preferred embodiment of the present invention, separation of the protective layer 70 from each electrode film 60 is able to be significantly reduced or prevented.

Second Modification

The protective layer 70 may be connected to the cover 50 or the support 40 or both and may be connected also to the substrate 10 in the through-holes 80.

Figure 7:
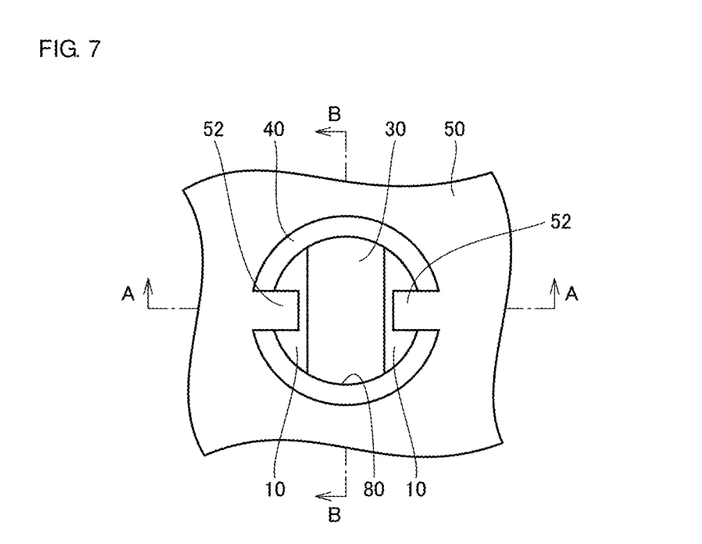
FIG. 7 is an enlarged plan view of a structure in a vicinity of a through-hole of an acoustic wave device according to a second modification of a preferred embodiment of the present invention.
Figure 8:
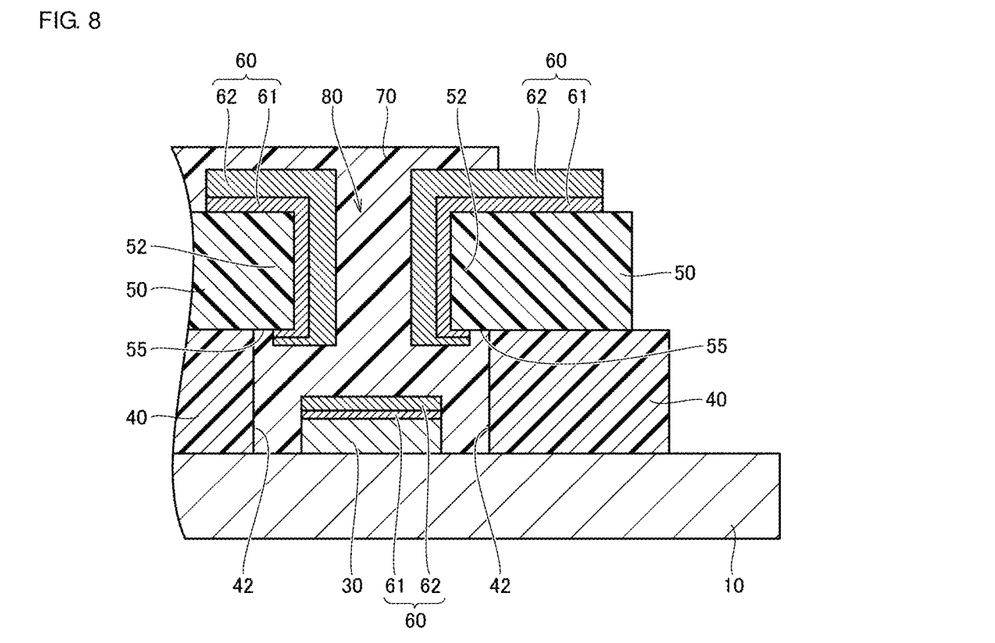
FIG. 8 is a sectional view taken along line A-A in FIG. 7.
Figure 9:
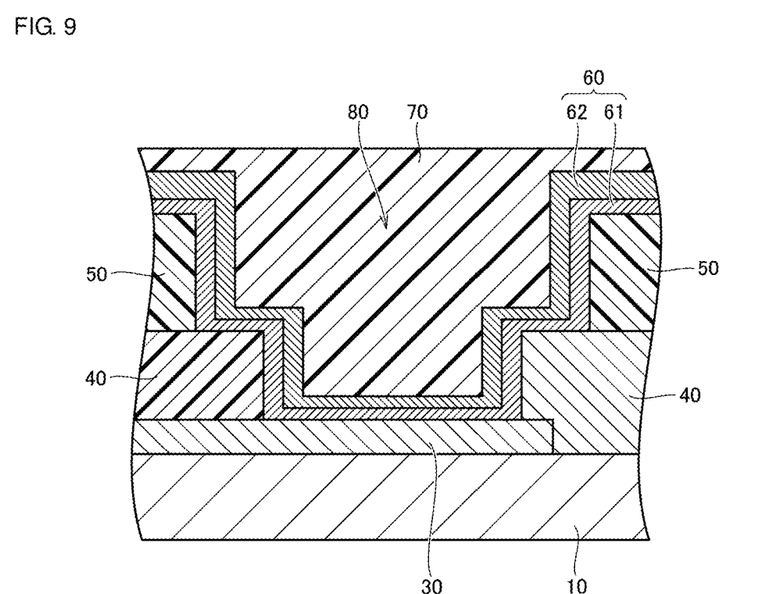
FIG. 9 is a sectional view taken along line B-B in FIG. 7.

FIG. 7 is an enlarged plan view of a structure in a vicinity of one of the through-holes 80 of an acoustic wave device according to a second modification of a preferred embodiment of the present invention. In FIG. 7, the electrode film 60 and the protective layer 70 are not shown. FIG. 8 is a sectional view taken along line A-A in FIG. 7. FIG. 9 is a sectional view taken along line B-B in FIG. 7.

As shown in FIG. 7, the wiring line 30 and the substrate 10 are exposed to the through-hole 80. The substrate 10 is exposed to the through-hole 80 in regions in which the substrate 10 overlaps the projecting portions 52. Accordingly, as shown in FIG. 8, the electrode film 60 is not provided on at least a portion of the substrate 10 in the through-hole 80. Accordingly, the protective layer 70 is connected to the substrate 10 in the through-hole 80 in addition to the cover 50 and the support 40. As shown in FIG. 9, in a region in which the projecting portions 52 are not provided, the electrode film 60 is provided along a side wall surface around the through-hole 80, and the electrode film 60 is electrically connected to the wiring line 30.

In the acoustic wave device according to the second modification, the substrate 10 and the wiring lines 30 are exposed to the through-holes 80. Since the wiring lines 30 are provided on the substrate 10, steps are provided at edge portions of the wiring lines 30. Accordingly, the areas of contact between the protective layer 70 and the wiring lines 30 and between the protective layer 70 and the substrate 10 increase. Accordingly, joining force between the protective layer 70 and the wiring lines and between the protective layer 70 and the substrate 10 increases, and separation of the protective layer 70 from each electrode film 60 is able to be further significantly reduced or prevented when the acoustic wave device 100 is mounted on the mounting substrate.

Third Modification

Figure 10:
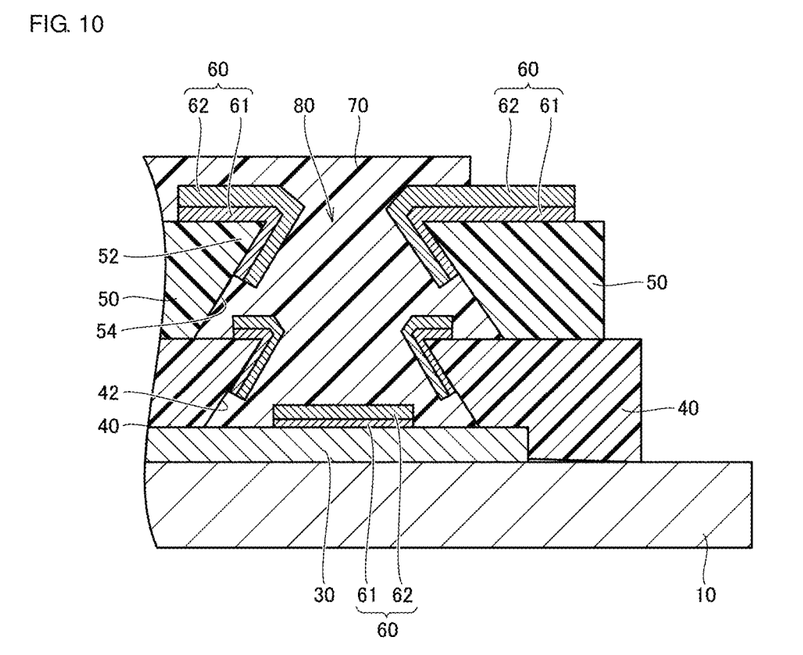
FIG. 10 is a sectional view of a structure in a vicinity of a through-hole of an acoustic wave device according to a third modification of a preferred embodiment of the present invention.

FIG. 10 is a sectional view of a structure in a vicinity of one of the through-holes 80 of an acoustic wave device according to a third modification of a preferred embodiment of the present invention. In an example in FIG. 3, the side surface 54 of the projecting portion 52 of the cover 50 is perpendicular or substantially perpendicular to the substrate 10. In the acoustic wave device according to the third modification, however, the side surface 54 of the projecting portion 52 is inclined with respect to the substrate 10 in a direction toward the substrate 10. Accordingly, the electrode film 60 is not provided on a portion of the side surface 54, and the protective layer 70 is connected to the portion of the side surface 54. Similarly, the side surface 42 of the support 40 is inclined with respect to the substrate 10 in a direction toward the substrate 10. Accordingly, the electrode film 60 is not provided on a portion of the side surface 42, and the protective layer 70 is connected to the portion of the side surface 42.

Fourth Modification

In the above description, the acoustic wave device 100 includes the functional element 20 that includes the IDT electrodes. However, the acoustic wave device 100 may include the functional element 20 that includes a bulk acoustic wave resonator that includes a piezoelectric thin film on a substrate, for example, a silicon (Si) substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a substrate;
   a functional element that is provided on the substrate;
   a wiring line that is provided on the substrate and that is electrically connected to the functional element;
   a support that is made of an insulating material and that is provided around the functional element on the substrate; and
   a cover that is made of an insulating material, that covers the functional element, and that faces the substrate with the support interposed between the substrate and the cover; wherein
   a through-hole that extends from a first surface of the cover opposite the support to a second surface of the support that faces the substrate is provided in the support and the cover;
   the through-hole overlaps a portion of the wiring line in a plan view;
   the acoustic wave device further includes:
     an electrode film that is provided on the first surface and in the through-hole and that is electrically connected to the wiring line in the through-hole; and
     a protective layer that is made of an insulating material and that covers at least a portion of the first surface and a portion of the electrode film;
   the protective layer is connected to at least of the cover and the support in the through-hole; and
   a difference in thermal expansion coefficients between the protective layer and the at least one of the cover and the support is smaller than a difference in thermal expansion coefficients between the protective layer and the electrode film.

2. The acoustic wave device according to claim 1, wherein the protective layer is connected to the cover and the support in the through-hole.

3. The acoustic wave device according to claim 2, wherein an inner wall surface around the through-hole includes a third surface of the cover that faces the substrate and a fourth surface of the support that is adjacent to the third surface; and
   the protective layer is connected to the third surface and the fourth surface.

4. The acoustic wave device according to claim 1, wherein the protective layer is connected to the substrate in the through-hole.

5. The acoustic wave device according to claim 1, wherein the functional element includes at least one interdigital transducer electrode.

6. The acoustic wave device according to claim 5, wherein the at least one interdigital transducer electrode defines a surface acoustic wave resonator.

7. The acoustic wave device according to claim 1, wherein a metallic layer is provided between the wiring line and the functional element.

8. The acoustic wave device according to claim 1, wherein the insulating material of the support is a synthetic resin or a photosensitive resin.

9. The acoustic wave device according to claim 1, wherein the insulating material of the cover is an epoxy resin or polyimide.

10. The acoustic wave device according to claim 1, wherein a hollow space is defined by the substrate, the support, and the cover, and the functional element is located in the hollow space.

11. The acoustic wave device according to claim 1, wherein the support and the cover are integrally provided.

12. The acoustic wave device according to claim 1, wherein the electrode film is a multilayer film that includes a seed layer and a plating layer provided on the seed layer.

13. The acoustic wave device according to claim 1, wherein the protective layer covers an entirety or substantially an entirety of the first surface.

14. The acoustic wave device according to claim 1, wherein the difference in thermal expansion coefficients between the protective layer and the at least one of the cover and the support is between about 0 and about $10 \times 10^{-6}/K$; and the difference in thermal expansion coefficients between the protective layer and the electrode film is between about $30 \times 10^{-6}/K$ and about $50 \times 10^{-6}/K$.

* * * * *